United States Patent
Lin et al.

(10) Patent No.: US 11,289,160 B2
(45) Date of Patent: Mar. 29, 2022

(54) MEMORY DEVICE AND DATA WRITING METHOD

(71) Applicant: Winbond Electronics Corp., Taichung (TW)

(72) Inventors: Lih-Wei Lin, Hsinchu (TW); Ju-Chieh Cheng, Hemei Township (TW); Lung-Chi Cheng, Taichung (TW); Ying-Shan Kuo, Zhubei (TW); Yu-An Chen, Zhubei (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/067,341

(22) Filed: Oct. 9, 2020

(65) Prior Publication Data
US 2021/0210139 A1 Jul. 8, 2021

(30) Foreign Application Priority Data
Jan. 6, 2020 (TW) ................... 109100292

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0064* (2013.01)

(58) Field of Classification Search
CPC .............. G11C 13/0069; G11C 13/004; G11C 13/0064
USPC ......................................................... 365/148
See application file for complete search history.

(56) References Cited

U.S. PATENT DOCUMENTS

| 2006/0002180 A1* | 1/2006 | Frey ........................ G11C 16/10 365/158 |
| 2014/0281135 A1* | 9/2014 | Balakrishnan ....... G11C 7/1006 711/103 |
| 2016/0351259 A1* | 12/2016 | Jeon ........................ G11C 29/12 |

FOREIGN PATENT DOCUMENTS

| CN | 102870159 A | 1/2013 |
| CN | 103337255 A | 10/2013 |
| TW | 200842873 A | 11/2008 |

* cited by examiner

*Primary Examiner* — Vu A Le
(74) *Attorney, Agent, or Firm* — Birch, Stewart, Kolasch & Birch, LLP

(57) ABSTRACT

A data writing method is provided. According to the present application, the data writing method includes steps of receiving an expected data, performing a plurality of readings on a target storage unit to obtain a plurality of read data; determining whether the plurality of read data are the same as the expected data respectively to generate a plurality of comparison results; and performing a writing operation procedure on the target storage unit according to the plurality of comparison results and the expected data.

8 Claims, 4 Drawing Sheets

MEMORY DEVICE AND DATA WRITING METHOD

CROSS REFERENCE TO RELATED APPLICATIONS

This Application claims priority of Taiwan Patent Application No. 109100292, filed on Jan. 6, 2020, the entirety of which is/are incorporated by reference herein.

BACKGROUND OF THE INVENTION

Field of the Invention

This invention relates to data writing technology, and more particularly to a memory device and data writing method that can perform a plurality of verifications before performing a writing operation procedure.

Description of the Related Art

Memory devices are widely used in various electronic devices because they can be used to store information. In general, memory devices can be divided into volatile memory devices and non-volatile memory devices. Among the types of non-volatile memory devices, the development of resistive memories is the fastest in recent years, and the resistive memories become the most anticipated memories for structures of further memories. Because of simple structures, low power consumption, high operating speeds, and compatibility with complementary metal-oxide semiconductor processes of resistive memories, resistive memories are very suitable for becoming the next generation of non-volatile memory devices.

It is known that a resistive memory can be changed between two resistance states (such as a high resistance state and a low resistance state) by changing a voltage applied to the resistive memory, which is referred to as resistive switching. However, as the number of times the resistive memory is used increases, the performance of the resistive switching of the resistive memory will decrease, which induces a middle resistance state affecting the cycling performance. In addition, when a writing operation is performed to a resistive memory, the procedure of verification, writing, verification, and writing is generally repeated until the writing operation is performed successfully. However, the writing operation takes a lot of time.

BRIEF SUMMARY OF THE INVENTION

An embodiment of the present invention discloses a data writing method. The data reading method comprises the steps of receiving an expected data, performing a plurality of readings on a target storage unit to obtain a plurality of read data; determining whether the plurality of read data are the same as the expected data respectively to generate a plurality of comparison results; and performing a writing operation procedure on the target storage unit according to the plurality of comparison results and the expected data.

An embodiment of the present invention discloses a memory device. The memory device comprises a memory and a controller. The memory comprises a plurality of storage units. The controller is coupled to the memory. the controller receives an expected data. The controller performs a plurality of readings on a target storage unit among the plurality of storage units to obtain a plurality of read data and determines whether the plurality of read data are the same as the expected data respectively to generate a plurality of comparison results. The controller performs a writing operation procedure on the target storage unit according to the plurality of comparison results and the expected data.

The controller can perform a plurality of readings on a target storage unit in the plurality of storage units to obtain a plurality of read data, and the controller can compare whether the plurality of read data are the same as the expected data to generate a plurality of comparison results. The controller may perform a writing operation procedure on the target storage unit according to the complex comparison result and the expected data.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
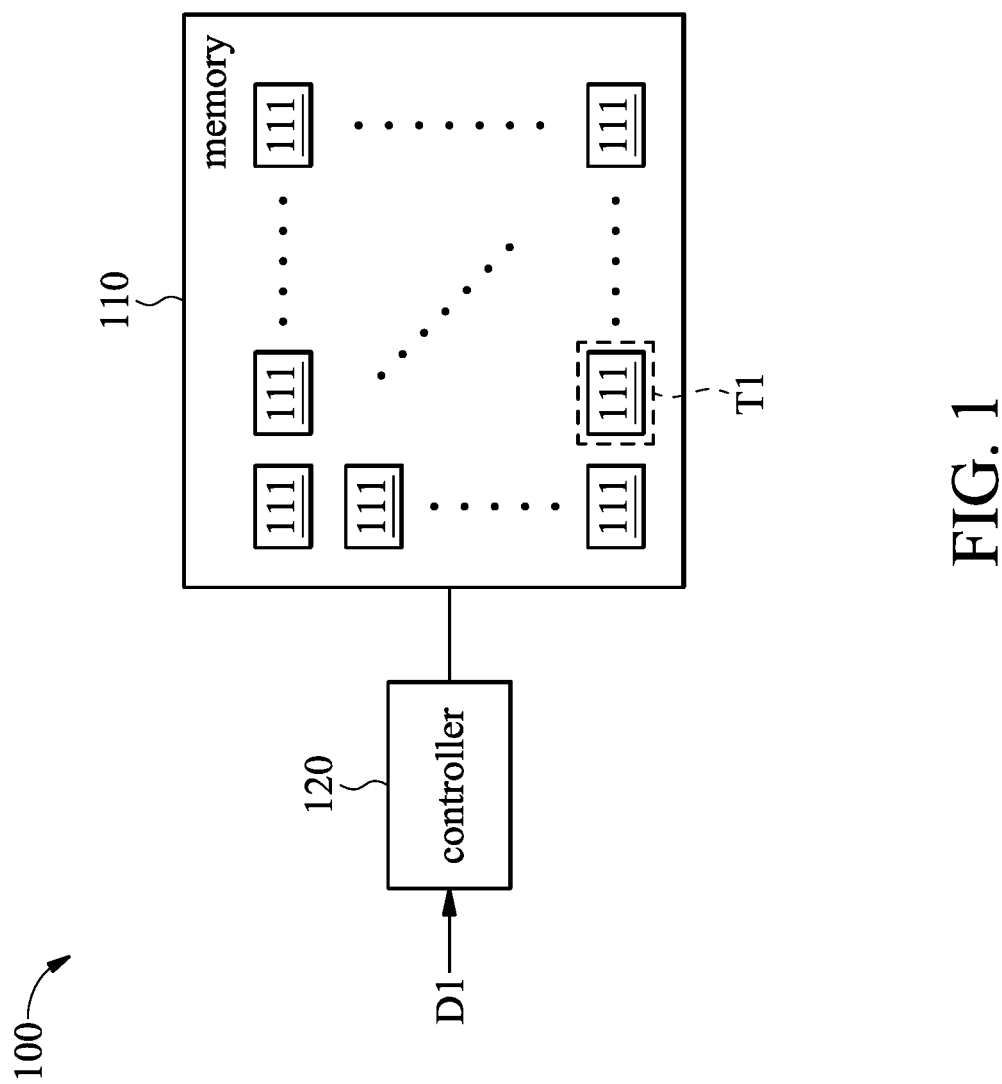
FIG. 1 is a block diagram of a memory device according to an embodiment of the invention.

FIG. 1 is a block diagram of a memory device according to an embodiment of the invention. Referring to FIG. 1, a memory device 100 comprises a memory 110 and a controller 120, and the controller 120 is coupled to the memory 110.

The memory 110 is used to store data and comprises a plurality of storage units 111 arranged in an array. In some embodiments, the memory 110 is a resistive memory, such as a resistive random-access memory (RRAM). Each of the plurality of storage units 111 may be a 1T1R structure composed of one transistor and one resistor, a 2T2R structure of two transistors and two resistors, or another suitable structure, however, the invention is not limited thereto.

The controller 120 can be used to access the memory 110, and can perform a corresponding writing operation on one of the plurality of storage units 111 (hereinafter referred to as the target storage unit T1) according to the data writing method of any embodiment of the present invention.

It is worth noting that, in order to clearly illustrate the present invention, FIG. 1 is a simplified block diagram in which only elements related to the present invention are shown.

Figure 2:
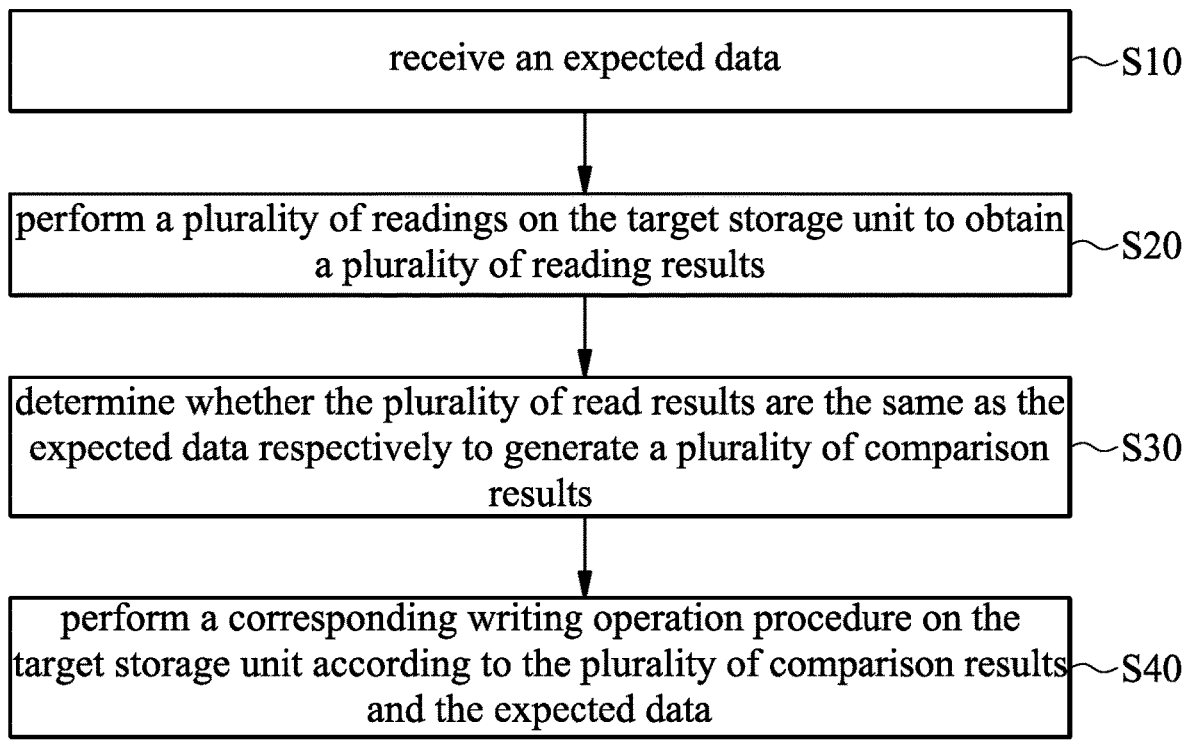
FIG. 2 is a schematic flowchart of an embodiment of a data writing method.

FIG. 2 is a schematic flowchart of an embodiment of a data writing method. Please refer to FIG. 1 and FIG. 2, in one embodiment, the controller 120 can start performing a data writing method in any embodiment of the present invention after receiving a write command sent by a host device (not shown), such as a computer or a host Data writing method. The write command comprises the expected data D1 and the address of the target storage unit T1.

According to one embodiment of a data writing method, the controller 120 receives the expected data D1 from the host device (step S10), and obtain the address of the target storage unit T1 according to the write command. The expected data D1 may be a first value or a second value. In some embodiments, the first value is "1", and the second value is "0". In other embodiments, the first value is "0" and the second value is "1". In the following paragraphs, the embodiments are described by taking the first value "1" and the second value "0".

After receiving the expected data D1, the controller 120 performs a plurality of readings on the target storage unit T1 to obtain a plurality of reading results (step S20). Each reading result may be the first value or the second value. The controller 120 compares each of the plurality of read results with the expected data D1 to determine whether each of the plurality of read results is the same as the expected data D1 to generate a plurality of comparison results (step S30). The controller 120 obtains one reading result every time one reading is performed, and the controller 120 obtains one comparison result every time the controller 120 performs the comparison between one read result and the expected data D1. Therefore, the number of performed readings, the number of reading results, the number of performed comparisons, and the number of comparison results are all the same.

In an embodiment of the step S20, when the target storage unit T1 is a resistive storage unit, the controller 120 obtains the reading results by measuring the current of the target storage unit T1, however, the present invention is not limited thereto. The method of reading the target storage unit T1 may depend on the type of the target storage unit T1.

In some embodiments, the controller 120 may continue to execute the step S30 after the execution of the step S20 is completed. For example, the controller 120 performs N readings on the target storage unit T1 continuously to obtain N reading results, and then compares the reading results with the expected data D1 respectively to obtain N comparing results, wherein, N is a positive integer greater than 1. In some embodiments, N may be 2. In other embodiments, N may be an odd number greater than 1, such as 3, 5, 7, etc., so that the controller 120 can easily determine a writing operation procedure based on a majority decision. One reading which is performed on the target storage unit T1 by the controller 120 may be referred to as a verification which is performed on the target storage unit T1, and the controller 120 performs a plurality of verifications on the target storage unit T1 continuously, however, the invention is not limited thereto.

In some embodiments, the controller 120 may execute the steps S20 and S30 together. For example, the controller 120 obtains one reading result and then compares the reading result obtained this time with the expected data D1, and the above procedure is repeated N times. In this case, one reading and one comparison performed by the controller 120 is collectively referred to as a verification which is performed on the target storage unit T1, and the controller 120 performs a plurality of verifications on the target storage unit T1 continuously.

After step S30, the controller 120 confirms the state of the target storage unit T1 according to the plurality of comparison results and the expected data D1, and the controller 120 performs a corresponding writing operation procedure on the target storage unit T1 according to the confirmed state (step S40).

It is worth noting that, after continuously performing a plurality of verifications on the target storage unit T1 to confirm the state of the target storage unit T1, the controller 120 performs a writing operation procedure once. In this way, the total writing time of the controller 120 can be greatly shortened. In addition, performing a plurality of verifications continuously can make the state of the target storage unit T1 confirmed by the controller 120 more accurate, which avoids inaccuracy in one-time verification. Furthermore, the write operation is performed once after the state of the target storage unit T1 is confirmed, so that the memory device 100 can have better durability and high temperature data retention (HTDR).

Figure 3:
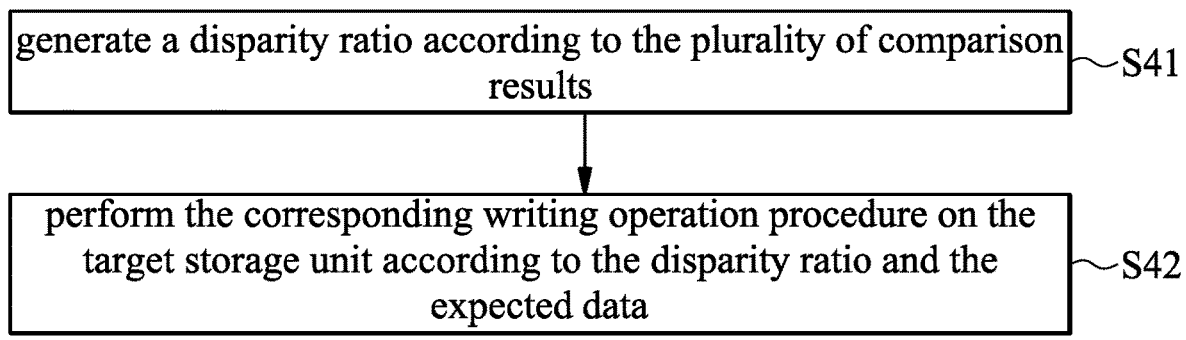
FIG. 3 is a schematic flowchart of an embodiment of the step S40 in FIG. 2.

FIG. 3 is a schematic flowchart of an embodiment of the step S40 in FIG. 2. Referring to FIG. 3, in an embodiment of the step S40, the controller 120 first generates a disparity ratio according to the plurality of comparison results (step S41). The controller 120 calculates the total number of comparison results indicating that the read data are different from the expected data D1. Then, the controller 120 divides the total number of comparison results which indicate that the corresponding read data are different from the expected data D1 by the total number of all comparison results to obtain the disparity ratio. After that, the controller 120 performs a corresponding writing operation procedure on the target storage unit T1 according to the disparity ratio and the expected data D1 (step S42).

Figure 4A:
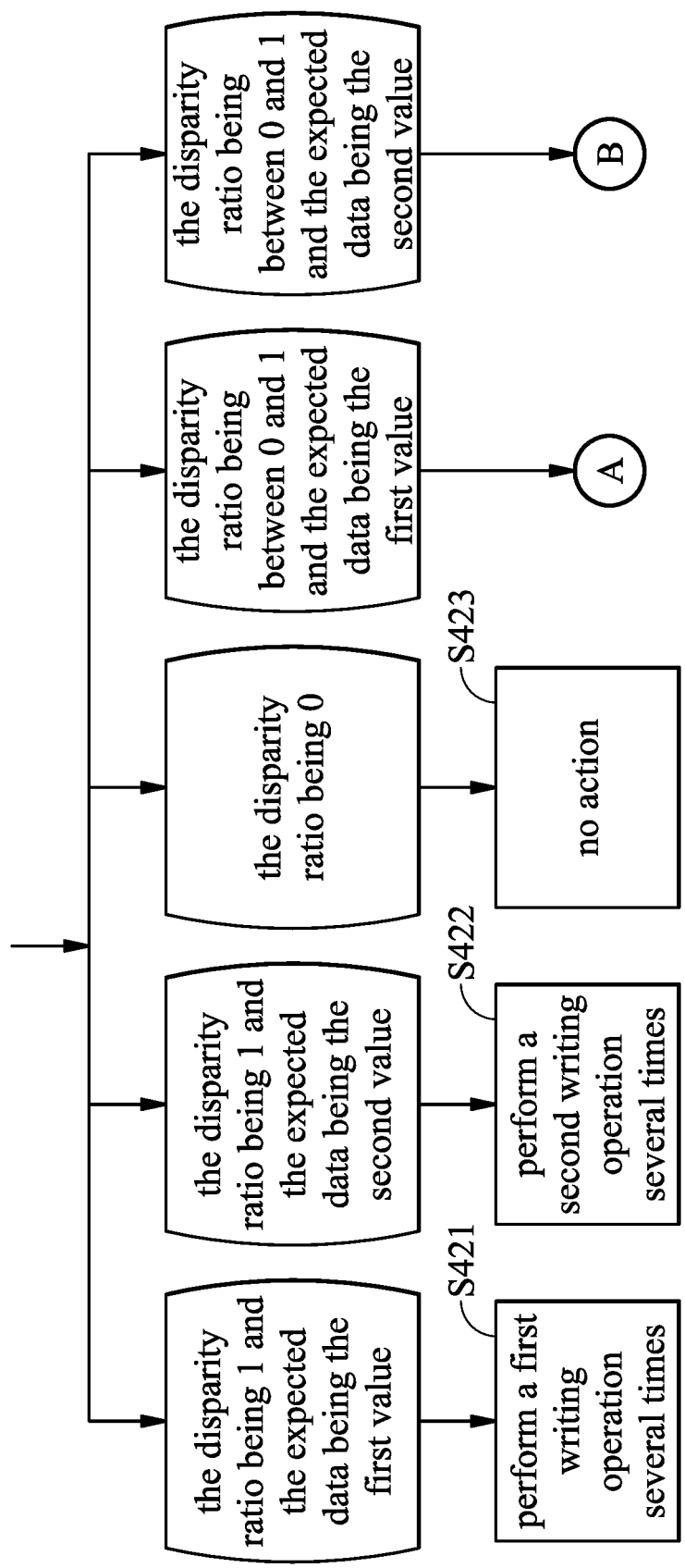
FIGS. 4A and 4B are schematic flowcharts of an embodiment of the step S42 in FIG. 3.
Figure 4B:
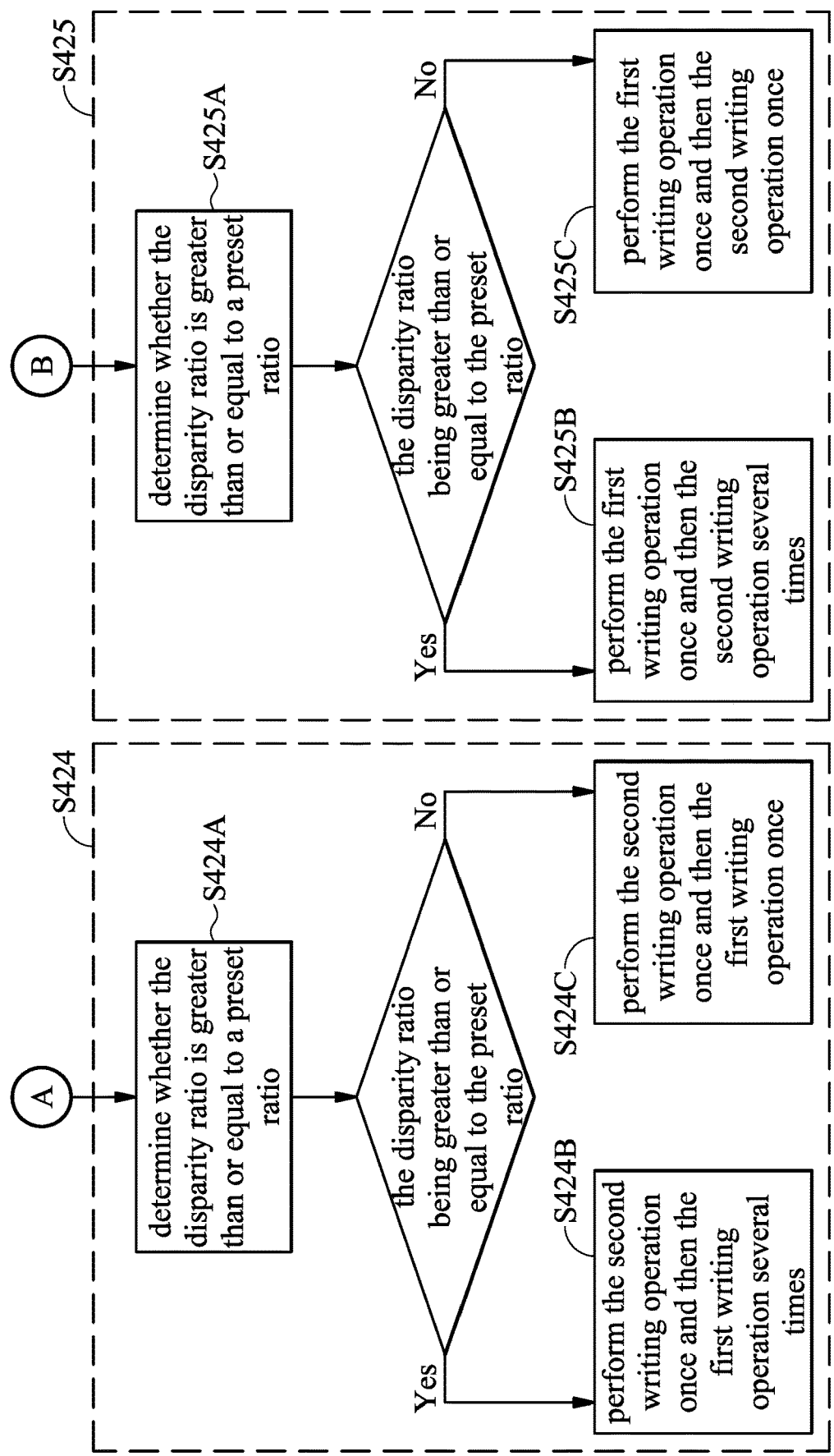

FIGS. 4A and 4B are schematic flowcharts of an embodiment of the step S42 in FIG. 3. Please refer to FIGS. 4A and 4B, in one embodiment of the step S42, the disparity ratio in the step S41 being equal to 1 indicates that the data stored in the target storage unit T1 is a solid value and is different from the currently written expected data D1. In order to write the expected data D1 which is different from the data stored in the target storage unit T1 into the target storage unit T1, the controller 120 performs a first writing operation for writing the first value several times according to the expected data D1 being the first value (step S421) or performs a second writing operation for writing the second value several times according to the expected data D1 being the second value (step S422). In the embodiment, the first writing operation or the second writing is performed at least two times, but the invention is not limited thereto.

For example, the case in which the disparity ratio in the step S41 is 1 and the expected data D1 is the first value indicates that the data stored in the target storage unit T1 is a solid second value. In this case, each of the read results, which are obtained through performing the reading N times on the target storage unit T1 by the controller 120, is the second value. At this time, in order to write the expected data D1 whose is the first value, the controller 120 chooses to perform the step S421 to perform the first writing operation for writing the first value several times on the target storage unit T1. In some embodiments, when the target storage unit T1 is a resistive storage unit, performing the first writing operations several times indicates that the controller 120 applies a reset voltage several time to the target storage unit T1 to set the target storage unit T1 changes to a high resistance state (HRS) from a solid low resistance state (LRS) (that is, the first value is written to the target storage unit T1), however, the present invention is not limited thereto. The actual content of the first writing operation for writing the first value may be determined according to the type of the target storage unit T1.

The case in which the disparity ratio in the step S41 is 1 and the expected data D1 is the second value indicates that the data stored in the target storage unit T1 is a solid first value. In this case, each of the read results, which are obtained through performing the reading N times on the target storage unit T1 by the controller 120, is the first value. At this time, in order to write the expected data D1 whose is the second value, the controller 120 chooses to perform the step S422 to perform the second writing operation for writing the second value several times on the target storage unit T1. In some embodiments, when the target storage unit T1 is a resistive storage unit, performing the second writing operations several times indicates that the controller 120 applies a set voltage several time to the target storage unit T1 to set the target storage unit T1 changes to the solid low resistance state (LRS) from the high resistance state (HRS) (that is, the second value is written to the target storage unit T1), however, the present invention is not limited thereto. The actual content of the second writing operation for writing the second value may be determined according to the type of the target storage unit T1.

In one embodiment of the step S42, the case in which the disparity ratio in the step S41 is 0 indicates that the data stored in the target storage unit T1 is a solid value and is the same as the currently written expected data D1. Therefore, the controller 120 selectively does not perform any actions this time (no action) (step S423) or other operations which are not performed to change the data stored in the target storage unit T1. In some embodiments, the step "non-action" indicates that the first writing operation or the second writing operation is not performed, but the invention is not limited thereto. In other embodiments, the step "non-action" indicate that a recover flow, a re-forming, or any other appropriate operation that is not used to change the data stored in the target storage unit T1 is performed.

In one embodiment of the step S42, the case when the disparity ratio in step S41 is between 0 and 1 indicates that the data stored in the target storage unit T1 is an unstable value, for example, the target storage unit T1 implemented by a resistive storage unit has a middle resistance state (MRS), so that the N reading results of the controller 120 are not completely the same. In order to write the expected data D1, according to the value of the expected data D1, the controller 120 first performs a writing operation for writing an opposite value and then performs a writing operation for writing the same value as the expected data D1.

For example, when the disparity value is between 0 and 1 and the expected data D1 is the first value, the controller 120 first performs the second writing operation for writing the second value on the target storage unit T1 and then performs the first writing operation for writing the first value on the target storage unit T1 (step S424). When the disparity ratio is between 0 and 1 and the expected data D1 is the second value, the controller 120 first performs the first writing operation for writing the first value on the target storage unit T1 and then performs the second writing operation for writing the second value on the target storage unit T1 (step S425).

Please refer to FIG. 4B, in an embodiment of the step S424, the controller 120 first compares the disparity ratio with a preset ratio to determine whether the disparity ratio is greater than or equal to the preset ratio (step S424A). In some embodiments, the preset ratio may be 1/2. For the case in which the determination result of the step S424A indicates that the disparity ratio is greater than or equal to the preset ratio, most or half of the comparison results indicate that the data stored in the target storage unit T1 is different from the currently written expected data D1. At this time, the controller 120 first performs the second writing operation for writing the second value once on the target storage unit T1 and then performs the first writing operation for writing the first value several times (such as M times) on the target storage unit T1 (step S424B), wherein M is a positive integer greater than 1. In some embodiments, M can be 2.

For the case in which the determination result of the step S424A indicates that the disparity ratio is less than the preset ratio, most of the comparison results indicate that the data stored in the target storage unit T1 is the same as the currently written expected data D1. At this time, the controller 120 first performs the second writing operation for writing the second value once on the target storage unit T1 and then performs the first writing operation for writing the first value once on the target storage unit T1 (step S424C).

In an embodiment of the step S424, the controller 120 first compares the disparity ratio with the preset ratio to determine whether the disparity ratio is greater than or equal to the preset ratio (step S425A). For the case in which the determination result of the step S425A indicates that the disparity ratio is greater than or equal to the preset ratio, most or half of the comparison results indicate that the data stored in the target storage unit T1 is different from the currently written expected data D1. At this time, the controller 120 first performs the first writing operation for writing the first value once on the target storage unit T1 and then performs the second writing operation for writing the second value several times (such as M times) on the target storage unit T1 (step S425B). For the case in which the determination result of the step S425A indicates that the disparity ratio is less than the preset ratio, most of the comparison results indicate that the data stored in the target storage unit T1 is the same as the currently written expected data D1. At this time, the controller 120 first performs the first writing operation for writing the first value once on the target storage unit T1 and then performs the second writing operation for writing the second value once on the target storage unit T1 (step S425C).

In summary, the embodiments of the present invention provide a memory device and a data writing method, which can confirm the state of the target storage unit more accurately by successively performing a plurality of verifications to avoid failure of a one-time verification. In addition, the memory device and the data writing method according to the embodiments of the present invention perform a writing operation procedure only after a plurality of verifications are performed continuously, so that the memory device has better durability and high temperature data retention (HTDR) and greatly reduce the total writing time required by the controller.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A data writing method comprising:
 receiving an expected data;
 performing a plurality of readings on a target storage unit to obtain a plurality of read data;
 determining whether the plurality of read data are the same as the expected data respectively to generate a plurality of comparison results; and performing a writing operation procedure on the target storage unit according to the plurality of comparison results and the expected data,
wherein performing the writing operation procedure on the target storage unit according to the plurality of comparison results and the expected data comprises:
generating a disparity ratio according to the plurality of comparison results, wherein the disparity ratio is obtained by dividing a total number of comparison results which indicate that the corresponding read data is different from the expected data by a total number of all of the plurality of the comparison results; and
performing the writing operation procedure on the target storage unit according to the disparity ratio and the expected data.

2. The data writing method as claimed in claim 1, wherein performing the writing operation procedure on the target storage unit according to the disparity ratio and the expected data comprises:
in response to the disparity ratio being 1 and the expected data being a first value, performing a first writing operation for writing the first value a plurality of times on the target storage unit;
in response to the disparity ratio being 1 and the expected data being a second value, performing a second writing operation for writing the second value a plurality of times on the target storage unit, wherein the second value is different from the first value;
in response to the disparity ratio being 0, performing no action;
in response to the disparity ratio being between 0 and 1 and the expected data being the first value, performing the second writing operation for writing the second value and then the first writing operation for writing the first value; and
in response to the disparity ratio being between 0 and 1 and the expected data being the second value, performing the first writing operation for writing the first value and then the second writing operation for writing the second value.

3. The data writing method as claimed in claim 2, wherein performing the second writing operation for writing the second value and then the first writing operation for writing the first value comprises:
determining whether the disparity ratio is greater than or equal to a preset ratio;
in response to the disparity ratio being greater than or equal to the preset ratio, performing the second write operation for writing the second value once and then the first write operation for writing the first value a plurality of times; and
in response to the disparity ratio being less than the preset ratio, performing the second write operation for writing the second value once and then the first write operation for writing the first value once.

4. The data writing method as claimed in claim 2, wherein performing the first writing operation for writing the first value and then the second writing operation for writing the second value comprises:
determining whether the difference ratio is greater than or equal to a preset ratio;
in response to the disparity ratio being greater than or equal to the preset ratio, performing the first write operation for writing the first value once and then the second write operation for writing the second value a plurality of times; and
in response to the disparity ratio being less than the preset ratio, performing the first write operation for writing the first value once and then the second write operation for writing the second value once.

5. A memory device comprising:
a memory comprising a plurality of storage units; and
a controller coupled to the memory, wherein the controller receives an expected data,
wherein the controller performs a plurality of readings on a target storage unit among the plurality of storage units to obtain a plurality of read data and determines whether the plurality of read data are the same as the expected data respectively to generate a plurality of comparison results, and
wherein the controller performs a writing operation procedure on the target storage unit according to the plurality of comparison results and the expected data,
wherein the controller further generates a disparity ratio according to the plurality of comparison results,
wherein the controller performs the writing operation procedure on the target storage unit according to the disparity ratio and the expected data, and
wherein the disparity ratio is obtained by dividing a total number of comparison results which indicate that the corresponding read data is different from the expected data by a total number of all of the plurality of the comparison results.

6. The memory device as claimed in claim 5, wherein the writing operation procedure comprises:
in response to the disparity ratio being 1 and the expected data being a first value, performing a first writing operation for writing the first value a plurality of times on the target storage unit;
in response to the disparity ratio being 1 and the expected data being a second value, performing a second writing operation for writing the second value a plurality of times on the target storage unit, wherein the second value is different from the first value;
in response to the disparity ratio being 0, performing no action;
in response to the disparity ratio being between 0 and 1 and the expected data being the first value, performing the second writing operation for writing the second value and then the first writing operation for writing the first value; and
in response to the disparity ratio being between 0 and 1 and the expected data being the second value, performing the first writing operation for writing the first value and then the second writing operation for writing the second value.

7. The memory device as claimed in claim 6, wherein in response to the disparity ratio being between 0 and 1 and the expected data being the first value, the writing operation procedure further comprises:
determining whether the disparity ratio is greater than or equal to a preset ratio;
in response to the disparity ratio being greater than or equal to the preset ratio, performing the second write operation for writing the second value once and then the first write operation for writing the first value a plurality of times; and
in response to the disparity ratio being less than the preset ratio, performing the second write operation for writing the second value once and then the first write operation for writing the first value once.

8. The memory device as claimed in claim 6, wherein in response to the disparity ratio being between 0 and 1 and the expected data being the second value, the writing operation procedure further comprises:
- determining whether the difference ratio is greater than or equal to a preset ratio;
- in response to the disparity ratio being greater than or equal to the preset ratio, performing the first write operation for writing the first value once and then the second write operation for writing the second value a plurality of times; and
- in response to the disparity ratio being less than the preset ratio, performing the first write operation for writing the first value once and then the second write operation for writing the second value once.

* * * * *